United States Patent
Huang et al.

(10) Patent No.: US 9,960,234 B2
(45) Date of Patent: May 1, 2018

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Kirk Huang, Chandler, AZ (US); Chun-Li Liu, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 14/508,266

(22) Filed: Oct. 7, 2014

(65) Prior Publication Data

US 2016/0099314 A1 Apr. 7, 2016

(51) Int. Cl.
| | |
|---|---|
| *H01L 29/78* | (2006.01) |
| *H01L 29/06* | (2006.01) |
| *H01L 29/423* | (2006.01) |
| *H01L 29/20* | (2006.01) |
| *H01L 27/06* | (2006.01) |
| *H01L 27/088* | (2006.01) |

(52) U.S. Cl.
CPC ...... *H01L 29/0696* (2013.01); *H01L 29/4236* (2013.01); *H01L 29/78* (2013.01); *H01L 27/0629* (2013.01); *H01L 27/0883* (2013.01); *H01L 29/2003* (2013.01)

(58) Field of Classification Search
None
See application file for complete search history.

(56) References Cited

U.S. PATENT DOCUMENTS

| | | | | | |
|---|---|---|---|---|---|
| 5,268,586 | A | * | 12/1993 | Mukherjee | .......... H01L 29/1095 257/335 |
| 5,886,515 | A | * | 3/1999 | Kelly | ....................... G01K 3/14 323/313 |
| 2005/0007200 | A1 | * | 1/2005 | Inoue | ..................... H03F 3/189 330/311 |
| 2010/0123187 | A1 | * | 5/2010 | Burke | ................... H01L 29/407 257/330 |
| 2012/0199875 | A1 | * | 8/2012 | Bhalla | ................. H01L 27/0629 257/134 |
| 2012/0262220 | A1 | * | 10/2012 | Springett | ......... H03K 17/04206 327/430 |
| 2013/0088280 | A1 | | 4/2013 | Lal et al. | |
| 2014/0217596 | A1 | * | 8/2014 | Otremba | ................. H01L 21/50 257/773 |

OTHER PUBLICATIONS

Machine-generated English translation of JP 2005-229066, total pp. 16.*
Kasahara et al., "Ka-band 2.3W Power AlGaN/GaN Heterojunction FET," 2002, IEEE, pp. 677-680.*

* cited by examiner

*Primary Examiner* — Kimberly Rizkallah
*Assistant Examiner* — Bo Bin Jang
(74) *Attorney, Agent, or Firm* — Robert F. Hightower

(57) ABSTRACT

In one embodiment, a method of forming an MOS transistor includes forming a threshold voltage (Vth) of the MOS transistor to have a first value at interior portions of the MOS transistor and a second value at other locations within the MOS transistor that are distal from the interior portion wherein the second value is less than the first value.

17 Claims, 6 Drawing Sheets

US 9,960,234 B2

METHOD OF FORMING A SEMICONDUCTOR DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, the electronics industry utilized various methods and structures to form semiconductor devices that included both a silicon metal oxide semiconductor (MOS) field effect transistor (FET) connected in a circuit with a gallium nitride (GaN) transistor. One example of a circuit that includes a GAN and a MOS FET is described in United States patent publication number 2013/0088280 of inventors Lal et al. that was published on Apr. 11, 2013.

In some applications that utilize a device that includes a silicon MOSFET and a GaN transistor, transient voltages can occur that can result in damaging the device. For example, when a signal is applied to disable or switch off the MOS transistor, the voltage on the drain of the transistor may change which can cause transient voltages on the gate electrode of the MOS transistor. In some cases, these transient voltages may be referred to as gate voltage bounce. Under some conditions, the transient voltages can result in unintentional enabling of the MOS transistor when the MOS transistor should be disabled. This unintentional enabling can result in shoot-through currents that could either cause increased power dissipation or could damage either one or both of the MOS transistor or the GAN transistor.

Additionally, in some configurations the GAN transistor may have a large leakage current. When both the GAN transistor and the MOS FET are disabled, the leakage current from the GAN transistor can result in a large drain-to-source voltage (Vds) being formed across the MOS transistor. In some cases, this large Vds voltage can reach the avalanche breakdown voltage of the MOS transistor which may eventually weaken the MOS transistor and/or cause a long-term reliability problem or even result in damaging the MOS transistor.

Accordingly, it is desirable to have a semiconductor device that includes a MOS transistor with reduced sensitivity to transient voltages on the gate electrode such as for example during disabling of the MOS transistor, or that can minimize damaged from current applied to the MOS transistor.

Figure 1:
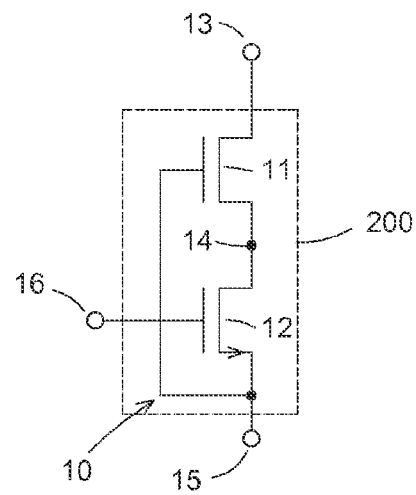
FIG. 1 schematically illustrates an example of an embodiment of a portion of a semiconductor device in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

FIG. 1 schematically illustrates an example of an embodiment of a portion of a semiconductor device 10 that includes a MOS transistor 12 and a heterojunction transistor 11. Transistor 11 may be formed from a variety of different combinations of materials including materials in the Group II or Group III series of the periodic table of elements. In one example embodiment, transistor 11 includes a GaN transistor that includes a GaN material. Device 10 functions and operates as a transistor which has a gate electrode or gate terminal 16, a source electrode or source terminal 15, and a drain electrode or drain terminal 13. In one embodiment, transistors 11 and 12 are connected in a cascode circuit configuration. In such an embodiment, transistor 11 has a drain connected to terminal 13 of device 10, a gate connected to a source of transistor 12 and to terminal 15, and a source that is connected to a common node 14. Transistor 12 includes a source connected to terminal 15 of device 10, a gate connected to terminal 16 of device 10, and a drain commonly connected to node 14 and the source of transistor 11. In some embodiments transistor 11 may have a higher breakdown voltage than transistor 12 which may allow device 10 to be used in higher voltage applications than transistor 12 alone could be used. In such an embodiment, transistor 12 may provide easier switching and control of device 10 than can be provided by transistor 11 alone. Device 10 is enabled to conduct current from the drain of transistor 11 to the source of transistor 12 in response to a voltage applied between the gate and source of transistor 12 that is greater than a gate-to-source threshold voltage (Vth) or threshold voltage (Vth) of transistor 12. Device 10 usually is disabled in response to the voltage applied between the gate and source of transistor 12 having a value that is less than the threshold voltage Vth of transistor 12. The threshold voltage (Vth) is the gate-to-source voltage at which the transistor begins to conduct current.

As will be seen further hereinafter, in one embodiment transistor 12 may be formed to minimize the susceptibility to transient voltages, such as for example reducing false enabling of transistor 12 or device 10 in response to the transient voltage, that may be induced on the gate of transistor 12, such as for example as a result of disabling device 10 or transistor 12. An embodiment may include forming transistor 12 to have a threshold voltage Vth that varies with distance along a length of a transistor 12 or alternately along a length of a transistor cell of transistor 12. In an embodiment, the doping concentration of a body region of a transistor cell of transistor 12 may be formed to vary from a first value near a distal end of a transistor cell to a second value toward an interior portion of the body region of the transistor cell. Another embodiment may include that transistor 12 is formed to minimize the susceptibility to leakage current received from transistor 11. An embodiment may include forming transistor 12 to minimize damage as a result of leakage current of transistor 11. In some embodiments, transistor 11 may be a depletion mode MOS transistor, and transistor 12 may be an enhancement mode heterojunction transistor.

An embodiment may include forming device 10 in a semiconductor package 200 as illustrated by dashed lines surrounding transistors 11 and 12. In an embodiment, device 10 may be formed as a hybrid circuit with transistors 11 and 12 formed as two separate die that are packaged together in common semiconductor package 200. However, transistors 11 and 12 might be formed together on one substrate and as one die in some embodiments.

Figure 2:
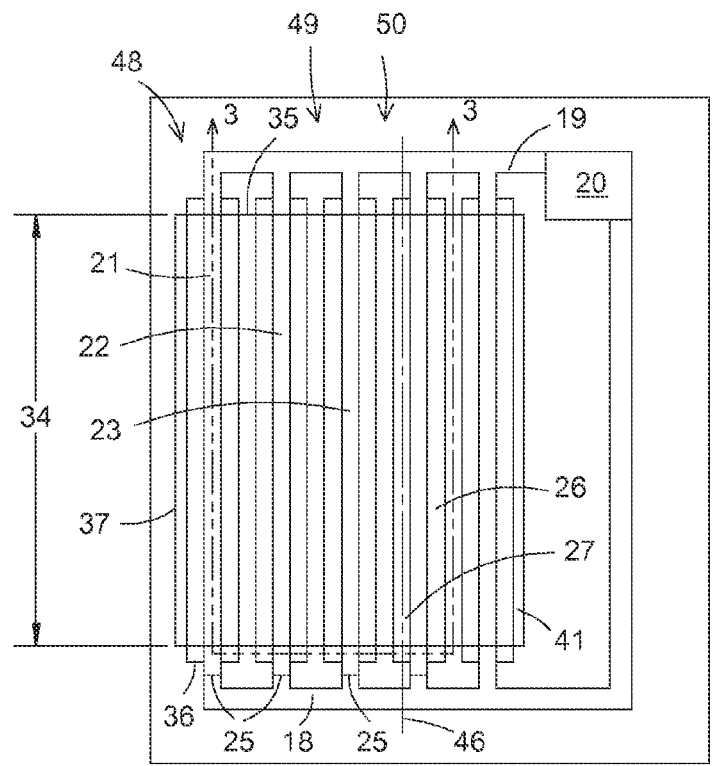
FIG. 2 illustrates an enlarged plan view of an example of an embodiment of a portion of a silicon MOS transistor that is an alternate embodiment of a transistor of device 10 in accordance with the present invention.

FIG. 2 illustrates an enlarged plan view of an example of an embodiment of a portion of a silicon MOS transistor 17 that is an alternate embodiment of transistor 12. In one embodiment, transistor 17 may be formed to have a gate-to-source threshold voltage (Vth) that reduces the probability that transistor 17 can be enabled by a transient gate-to-source voltage induced onto a gate of transistor 17. In one embodiment, transistor 17 may be formed as a plurality of transistor cells that are interconnected together to function as a single transistor similar to transistor 12 (FIG. 1). Transistor cells 48-50 illustrate examples of such transistor cells and are identified in a general manner by arrows. In one embodiment, each of the transistor cells, such as for example or cells 48-50, are formed as a stripe that extends across a semiconductor substrate. However, those skilled in the art will appreciate that the transistor cells may have other geometric configurations in other embodiments, such as for example formed as a serpentine shape. Each transistor cell includes a source region and a gate structure. One embodiment of the gate structure includes an internal gate conductor that is formed as a portion of the gate structure. In an embodiment, transistor 17 has a drain conductor 45 on a surface of substrate 42 that is opposite to the surface that faces toward a source conductor 28.

Transistor 17 may also include an external gate conductor, such as for example external gate conductors 18 and 19, that is utilized to form a low resistance electrical connection to the internal gate conductor. For example, conductors 18 or 19 may electrically and physically contact a portion of the internal gate conductor of one or all of the transistor cells. In some embodiments, external gate conductors 18 and 19 may also be used to provide an electrical connection between the internal gate conductor and a gate pad 20. Gate pad 20 typically facilitates connecting the gate conductors to a gate terminal of a package, such as to gate terminal 16 (FIG. 1) for example, such as by bonding wires or connection clips or other well-known means to connect a portion of a semiconductor device to a terminal of a semiconductor package.

Figure 3:
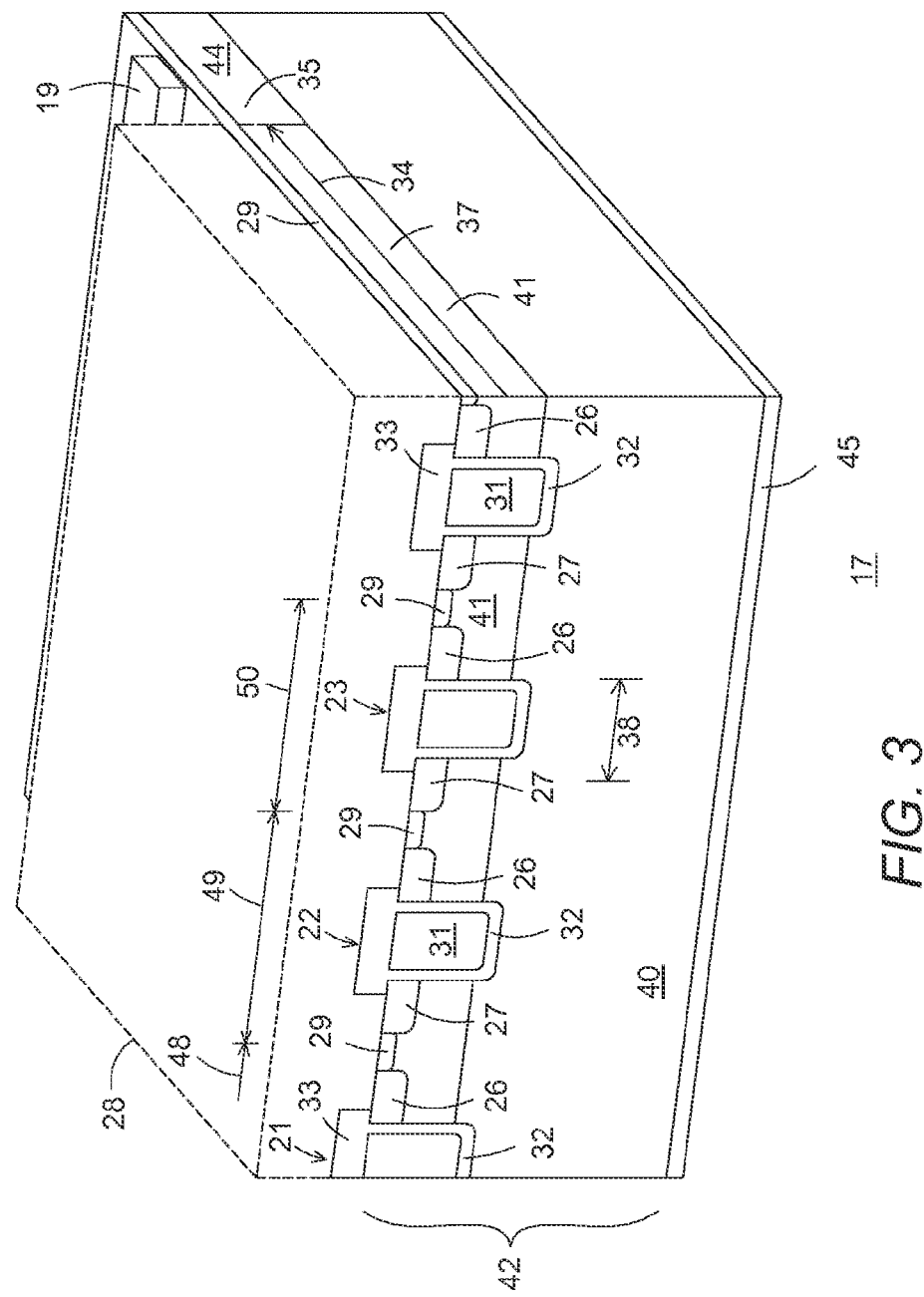
FIG. 3 illustrates an enlarged isometric view of a portion of the transistor of FIG. 2 in accordance with the present invention.

FIG. 3 illustrates an enlarged isometric view of a portion of transistor 17 along cross-section lines 3-3 of FIG. 2. This description has references to FIG. 2 and FIG. 3. In one embodiment, transistor 17 is formed on a semiconductor substrate 42. Substrate 42 typically includes a bulk semiconductor substrate 40. In some embodiments, one or more epitaxial layers may be formed on or overlying substrate 40. At least a portion of a doped region 41 of substrate 42 forms a body region of transistor 17. Transistor cells 48-50, as representative of other transistor cells of transistor 17, may also include a body region that is a portion of the body region of transistor 17. In one embodiment, region 41 is formed as a silicon epitaxial layer on substrate 40. In other embodiments, region 41 may be formed as a doped region of substrate 40 or a doped region of another epitaxial layer (not shown in FIG. 3). The body region of one or more of cells 48-50 has a distal end 35 that is positioned toward or near an end of region 41 toward conductor 19 and a distal end 36 that is positioned toward or near an end of region 41 toward conductor 18. An interior portion of the body region is positioned along length 34 away from ends 35 and 36. In one embodiment, an interior portion of the body region is illustrated as a location or position 37. End 35 is illustrated in a general manner in FIG. 3 by a dashed line. Those skilled in the art will appreciate that body region 41 typically ends near the end of the active source region of the cell and in some embodiments may extend a distance past the end of the active source region. A doped region 44 may be a portion of region 41 that is external to the body region of a cell, such as one of cells 48-50, or external to the body region of transistor 17. In some embodiments, region 44 may be a termination region of the body region. In most embodiments, region 44 does not extend to the edge of the die. Region 44 may be omitted in some embodiments. An embodiment may include that gate structures 21-23 are formed adjacent to the body region such as for example adjacent to at least a portion of region 41.

Transistor cells 48-50, as representative of other transistor cells of transistor 17, include respective gate structures 21-23. Doped regions 26 and 27 form the source regions of each of cells 48-50. In one embodiment gate structures 21-23 may extend from the surface of region 41 through region 41 and into an underlying layer, such as substrate 40 for example. In an embodiment, gate structures 21-23 may be formed as trench type gates that extend into the body region such as into region 41 or in some embodiments through region 41. Structures 21-23 typically include a gate insulator 32 that is positioned along a bottom and sides of an internal gate conductor 31 to provide isolation between conductor 31 and any adjacent semiconductor materials such as adjacent portions of region 41 or regions 26 and 27. Structures 21-23 may also include a cap insulator 33 overlying the top of conductor 31 to insulate conductor 31 from other electrical elements such as for example for a source conductor 28 of transistor 17 (illustrated in general by dashed lines).

Doped regions 26 and 27 may be formed on opposite sides of each of gate structures 48-50 such that each of gate structures 21-23 are formed adjacent to the source regions. Those skilled in the art will appreciate that regions 26 and 27 may be formed as one doped region that is separated during the formation of gates structures 21-23. In one embodiment, each of cells 48-50 also includes at least a portion of a body contact region 29. Contact region 29 is a doped region formed in region 41 to provide a low resistance electrical connection to region 41, thus to the body region. Regions 29 typically are formed between the source regions of adjacent cells in order to minimize resistance. For example, regions 29 may be formed in the middle between cells 48 and 49 so that a portion of region 29 may fall within each adjacent cell. In other embodiments, each cell may end at and the next cell may begin at an edge of a region 29. In other embodiments, fewer body contact regions may be used, thus, each transistor cell may not include a body contact region 29 or a portion of a body contact region 29.

In an embodiment, substrate 40 may have an N-type conductivity. In an embodiment region 41 may have a P-type conductivity. An embodiment may include that regions 26 and 27 may be formed to have an N-type conductivity. An embodiment may include that regions 29 are formed to have a P-type conductivity. Those skilled in the art will appreciate that current flows from the source, such as from regions 26 and 27, through the body region, such as through region 41 and through.

For the example embodiment where cells 48-50 are formed as stripes, one embodiment of cells 48-50 typically has a width, such for example the width across a gate structure between outside edges of regions 26 and 27 (illustrated by an arrow 38). In other embodiments, the width may be the distance between the centers of contact regions 29. Cells 48-50 also have a length that extends laterally across substrate 40 as the cells extend from near conductor 19 toward conductor 18 (FIG. 2). In some embodiments, the cell length may be a portion of the distance from the external conductor to an interior portion of the cell. For example, the cell may be sub-divided into section with each section having a cell length. The body region of each cell also has a length 34 that extends parallel to the length of each cell. In some embodiments, length 33 may be less than the length of an adjacent region 26 or 27, or in other embodiments may be equal to or greater than the length of an adjacent region 26 or 27. Length 34 may not extend all the way to external gate conductors 18 and 19.

Figure 4:
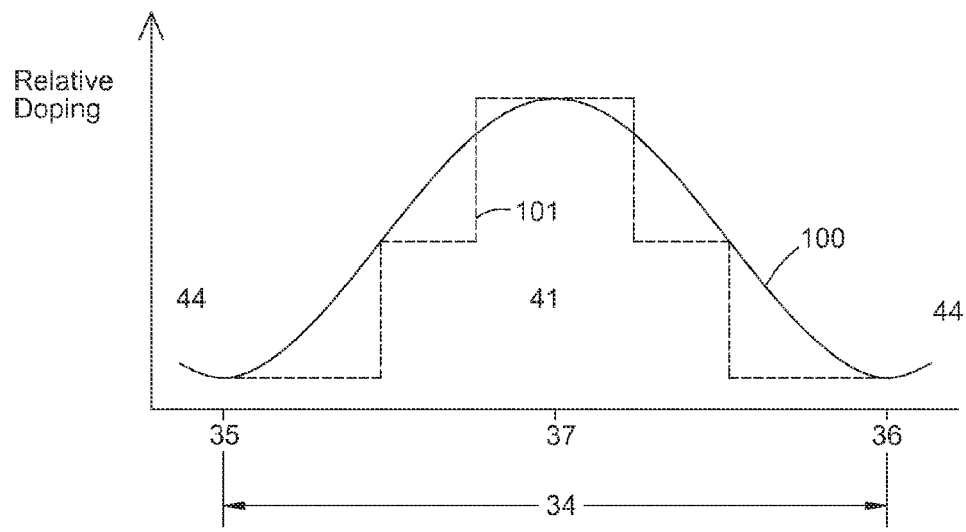
FIG. 4 is a graph having a plot that illustrates one example embodiment of a relative doping concentration for the body region of the transistor of FIGS. 2 and 3 in accordance with the present invention.

FIG. 4 is a graph having a plot 100 that illustrates one example embodiment of a relative doping concentration for the body region of transistor 17). In an embodiment, plot 100 illustrates the relative peak doping concentration at points along the body region. The abscissa indicates distance and the ordinate indicates increasing value of the relative doping concentration. An embodiment of transistor 17 is formed to have a threshold voltage Vth that varies between different positions along length 34 of the body region, such as for example of region 41. In one embodiment, the doping concentration of region 41 is formed to vary from a first value near one distal end of the body region, such as for example distal end 35 or 36, to a second value that is located toward an interior portion of the body region, such as for example near interior position 37 of region 41. In another embodiment, the doping concentration of the body region of transistor 12 may vary along length 34 as it extends away from either or both of distal ends 35 or 36. An embodiment may include that the doping concentration increases with increasing distance along length 34 from each of distal ends 35 and 36 toward the interior portion of the transistor cell such as toward an interior portion of the body region or of region 41. For example, the doping concentration may vary along length 34 by various factors relative to the doping concentration near distal ends 35. In one example embodiment, the doping concentration near region 37 may be a factor of two or more times the doping concentration near ends 35. In otter embodiments, the factor may vary linearly or non-linearly from ends 35 to position 37. The doping concentration illustrated by plot 100 is merely one example and the doping concentration may vary in other manners. For example, the doping concentration may vary non-linearly instead of the linear variation illustrated in plot 100. In an embodiment, the non-linear variation may include varying in one or more discrete increments as illustrated by dashed line plot 101. The increments of the steps may or may not be equal. Those skilled in the art will appreciate that region 44 is the portion of region 41 past length 34 and outside of the region bounded by ends 35 and 36. In one embodiment, the doping concentration of region 44 is substantially constant along the length of region 44, however it may vary according to depth as is known in the art. In some embodiments, the doping concentration of region 44 may be greater than or less than or may vary differently than the doping concentration of region 41. In other embodiments, region 44 may have a doping concentration that varies with distance away from ends 35 and 36.

Varying the threshold voltage, such as by varying the doping concentration of body 41 or varying the gate insulator thickness along length 34, generates different local threshold voltage (Vth) values along 34. In one embodiment for example, near ends 35 and 36 the Vth may have minimum value expected for the device as a whole, and at points away from ends 35 and 36 toward position 37, Vth may have a higher value that can prevent the unintentional enabling. In some embodiments, these local Vth values may be lower than the on-state gate drive voltage provided by the application and in some embodiments substantially lower.

Figure 5:
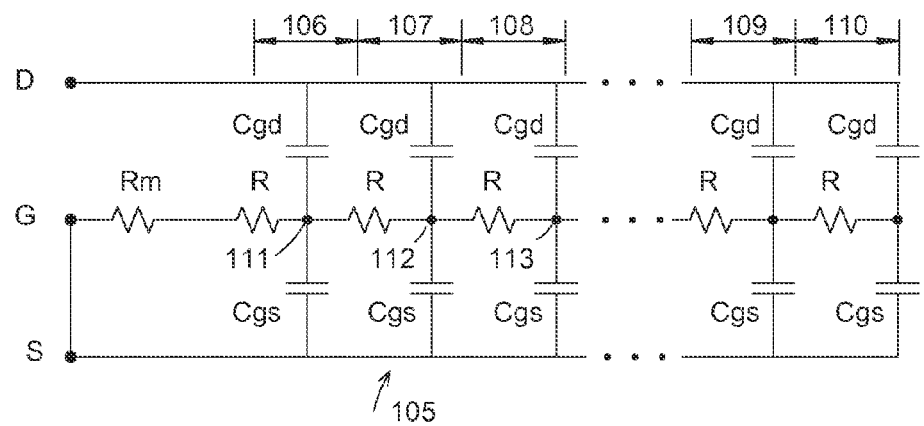
FIG. 5 schematically illustrates an example of an embodiment of a portion of a distributed element circuit model that can be utilized for evaluating some parameters of the transistor of FIGS. 2 and 3 in accordance with the present invention.

FIG. 5 schematically illustrates an example of an embodiment of a portion of a distributed element circuit model or distributed element circuit 105 that can be utilized for evaluating some parameters of a transistor cell such as for example a cell of transistor 17, such as one of cells 48-50. Those skilled in the art will appreciate that because the transistor cell has a length, the transistor cell can be modeled as a distributed element transistor using circuit 105. Circuit 105 illustrates one example circuit model that may be utilized for each of cells 48-50 along the distance from end 35 to interior position 37. Other models may also be applicable. As can be seen from circuit 105, the transistor cell can be modeled as a plurality of distributed circuit elements or distributed elements, for example such as those illustrated as elements 106-110. In an embodiment, each distributed element 106-110 represents a location along length 34 of the transistor cell. Each of distributed elements 106-110 includes a resistor R that represents a gate input resistance of the distributed element at that particular location along length 34, a drain-to-gate capacitance (Cgd) that represents the capacitance between the gate and drain of the distributed element at the location, and a gate to source capacitance (Cgs) that represents the capacitance between the gate and source of the distributed element at the location, and a common node that is commonly connected to one terminal of R, Cgd, and Cgs of the distributed element. Nodes 111-113 are representative of common nodes for respective distributed elements 106-108.

In an embodiment, such as for example as can be seen from circuit 105, a signal may be applied to the gate (G) of a transistor cell to disable the transistor or transistor cell. In some embodiments, the voltage on the drain (D) may increase quickly thereby increasing Vds. The positive dV/dt on the drain can induce a transient gate-source voltage, such as for example a gate voltage bounce.

It has been found that inside the transistor cell, the gate-to-source voltage may have different local values at different locations such as for example along length 34. Circuit 105 illustrates that local induced gate-to-source voltage may increase from node 111, to node 112, to node 113, etc. depending on the values for each of the R, Cgd, and Cgs elements of each distributed element. The highest local gate-to-source voltage usually is at the node the farthest from distal ends 35, such as for example near interior point 37. At some point, the local gate-to-source voltage may become large enough to enable the transistor cell and the entire transistor. It has also been found that forming the transistor cell to have a Vth threshold voltage that varies along the length of the transistor cell can keep the local Vth higher than the local induced gate-to-source voltage at the local position, and that this increase Vth can reduce unintended enabling of the transistor. It has been also been found that varying the doping concentration of region 41 along the length of the transistor cell can result in changing the Vth of the distributed elements of the transistor cell, such as for example changing the doping concentration along length 34. Changing the threshold voltage (Vth), such as for example the local Vth, for each distributed element results in a different voltage required to enable different distributed elements. For example, increasing the doping concentration, thus increasing the Vth, for increasing distance into the interior of each transistor cell requires a larger voltage to enable the distributed element at the location having the increased doping concentration. As a result, transistor 17 is formed to have a decreased sensitivity to transient voltages that are formed at the gate of transistor 17. In one embodiment, the doping concentration may be formed to vary along length 34 similarly to the manner that induced gate-to-source voltage varies along length 34. In an embodiment, the doping concentration may be formed to vary, such as for example increase, along length 34 from either one or both of ends 35 and 36 toward position 37 similarly to the manner that the induced gate-to-source voltage increases along length 34. Additionally, in an embodiment the Vth may be varied by varying the thickness of the gate insulator. For example the thickness of a gate insulator such as for example insulator 32 (FIG. 3), may be increased along the length of the cell. In an embodiment, transistor 17 may be formed to have a gate insulator thickness that varies from a first value near either one or both of ends 35 and 36 to a second value near position 37. An embodiment may include that the gate insulator thickness increases along distance 34 between either one or both of ends 35 and 36 to position 37. Another embodiment may include varying one of or both the gate insulator thickness and the doping concentration along length 34.

Figure 6:
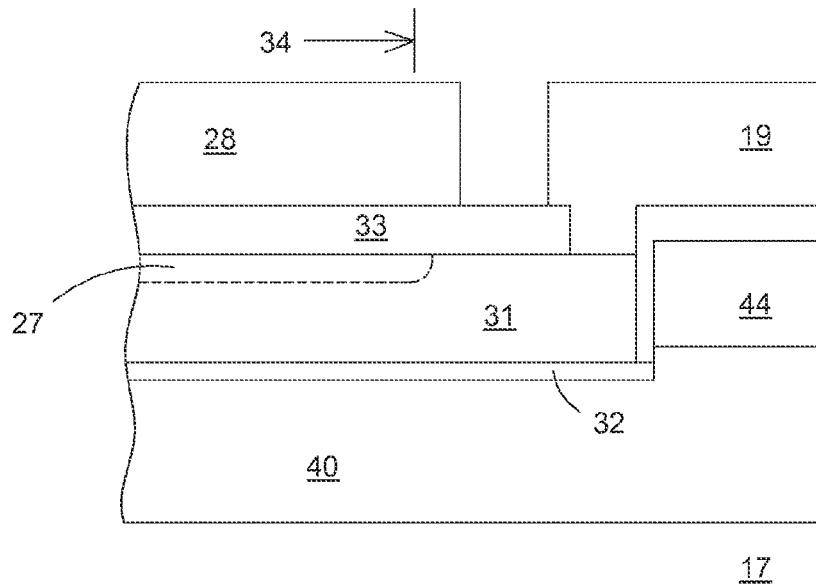
FIG. 6 illustrates an enlarged cross-section of an example of an embodiment of another portion of the transistor of FIGS. 2 and 3 in accordance with the present invention.

FIG. 6 illustrates an enlarged cross-section of an example of an embodiment of a portion of transistor 17 that illustrates external gate conductor 19 forming an electrical connection to internal gate conductor 31. Doped region 27 is illustrated in phantom dashed lines because region 27 is behind conductor 31 and can not be seen directly in the view of FIG. 6.

Figure 7:
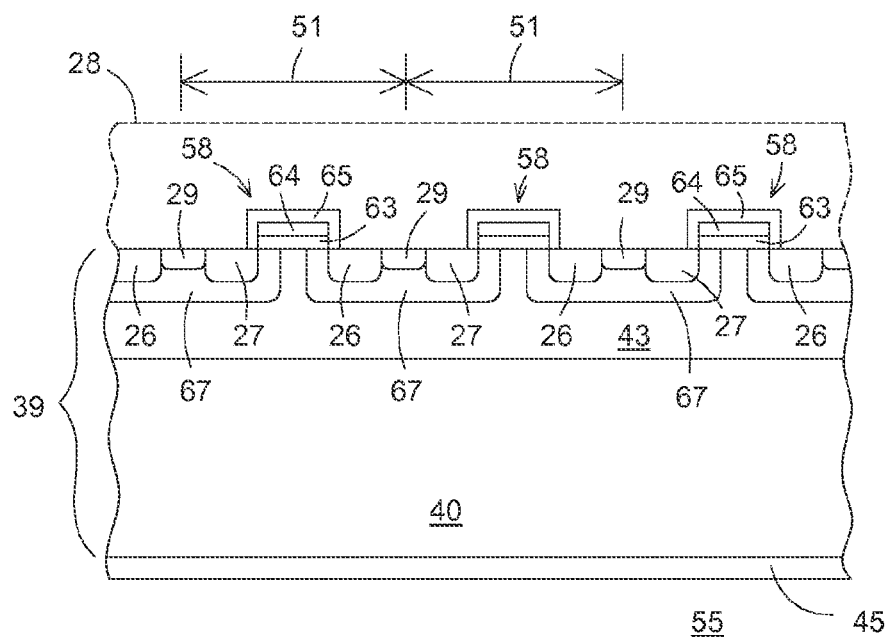
FIG. 7 illustrates an enlarged cross-section of an example of an embodiment of a portion of another silicon MOS transistor that is an alternate embodiment of the transistors of FIGS. 1-3 in accordance with the present invention.

FIG. 7 illustrates an enlarged cross-section of an example of an embodiment of a portion of a silicon MOS transistor 55 that is an alternate embodiment of transistors 12 or 17. Transistor 55 is formed as a planar vertical MOS transistor that is formed on a semiconductor substrate 39. Substrate 39 includes bulk semiconductor substrate 40. Substrate 39 also includes a doped semiconductor region 43 that may have the same conductivity type as substrate 40. Region 43 may be formed as an epitaxial layer on or overlying substrate 40 or may be formed as a doped region within substrate 40 or within a semiconductor layer overlying substrate 40.

Transistor 55 includes a plurality of transistor cells 51 that are formed as stripes having a length similar to cells 48-50 (FIG. 1) except that cells 51 do not include a trench type gate structure. Each of cells 51 include a body region formed as a doped region 67 and a gate structure 58. Gate structures 58 typically include a gate insulator 63, an internal gate conductor 64 overlying insulator 63, and a gate structure insulator 65 surrounding the top and sides of conductor 64 and optionally surrounding the sides of insulator 63. An embodiment may include that gate structure 58 is formed adjacent to the body region such as for example adjacent to at least a portion of region 67. In one embodiment, region 67 typically has a conductivity type that is opposite to that of regions 26 and 27 and to the conductivity type of region 43. In an embodiment, transistor 55 includes a plurality of regions 67 with each transistor cell sharing a portion of two adjacent regions 67. Portions of region 67 that are adjacent to source regions 26 and 27 and underlying gate structures 58 form a channel region of transistor 55, and region 43 forms a drift region for transistor 55. As explained hereinbefore the doping concentration or doping profile of region 67 varies in the same manner as the doping concentration of region 41 (FIG. 3) varies.

Figure 8:
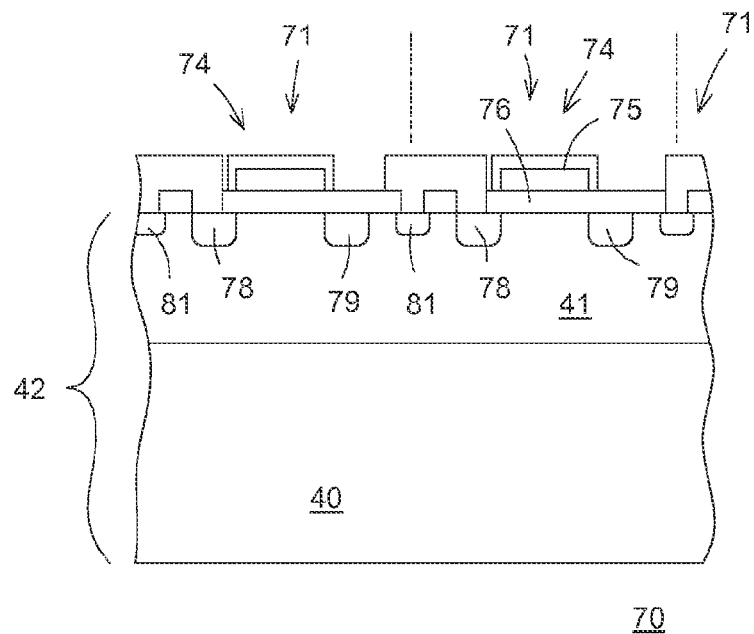
FIG. 8 illustrates an enlarged cross-section of an example of an embodiment of a portion of another silicon MOS transistor that is an alternate embodiment of the transistors FIGS. 1-3 and 7 in accordance with the present invention.

FIG. 8 illustrates an enlarged cross-section of an example of an embodiment of a portion of a silicon MOS transistor 70 that is an alternate embodiment of transistors 12 or 17 or 55. Transistor 70 is formed as a lateral MOS transistor that is formed on substrate 42. Transistor 70 includes a plurality of transistor cells 71 that are formed as stripes similar to cells 48-50 (FIG. 1). Each of cells 71 include a body region formed as at least a portion of doped region 41, source regions 78, drain regions 79, and body contact regions 81. Regions 81 function similarly to regions 29 (FIG. 3). A gate structure 74 is formed similarly to gate structures 58 and include gate insulator 76, internal gate conductor 75, and gate structure insulator overlying conductor 75. An embodiment may include that gate structure 74 is formed adjacent to the body region such as for example adjacent to at least a portion of region 41. Regions 78 and 79 are formed in region 41 and spaced laterally apart with one of gate structures 74 positioned between regions 78 and 79. The portion of region 41 position laterally between regions 78 and 79 forms a channel region and drift region for transistor 70. The doping concentration and or doping profile of region 41, and especially the channel region portion of region 41, varies in the manner similar to the doping profile of region 41 (FIG. 3).

Figure 9:
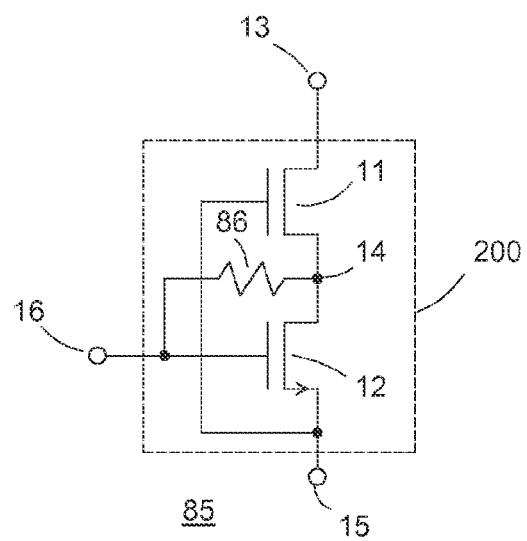
FIG. 9 schematically illustrates an example of an embodiment of a portion of a semiconductor device 85 that is an alternate embodiment of device 10. Device 85 is substantially similar to device 10 except that device 85 includes a resistor 86 connected between the drain and gate of transistor 12.

FIG. 9 schematically illustrates an example of an embodiment of a portion of a semiconductor device 85 that is an alternate embodiment of device 10. Device 85 is substantially similar to device 10 except that device 85 includes a resistor 86 connected between the source and gate of transistor 12.

Without resistor 86 and in the state where both transistors 11 and 12 are disabled, leakage current from transistor 11 can exceed the leakage current of transistor 12 and result in the formation of a drain-to-source voltage (Vds) being formed across transistor 12. in some cases the Vds voltage can reach the avalanche breakdown voltage of transistor 12. This large Vds voltage may cause a long-term reliability problem or eventually even result in damaging transistor 12.

However, resistor 86 reduces the Vds that results from the leakage current of transistor 11. If transistor 12 is disabled, the gate of transistor 12 is at a low level near to the value of the voltage on the source of transistor 12. Resistor 86 shunts the leakage current from transistor 11 to flow through resistor 86 to the circuit connected to the gate of transistor 12 instead of charging the drain-to-source capacitance of transistor 12. Thus, the Vds voltage across transistor 12 is reduced to a value that does not cause damage to transistor 12. Additionally, for the state in which transistor 12 is enabled, substantially no current flows through resistor 86. Thus, resistor 86 assists in minimizing damage to transistor 12 as a result of the leakage current of transistor 11.

Figure 10:
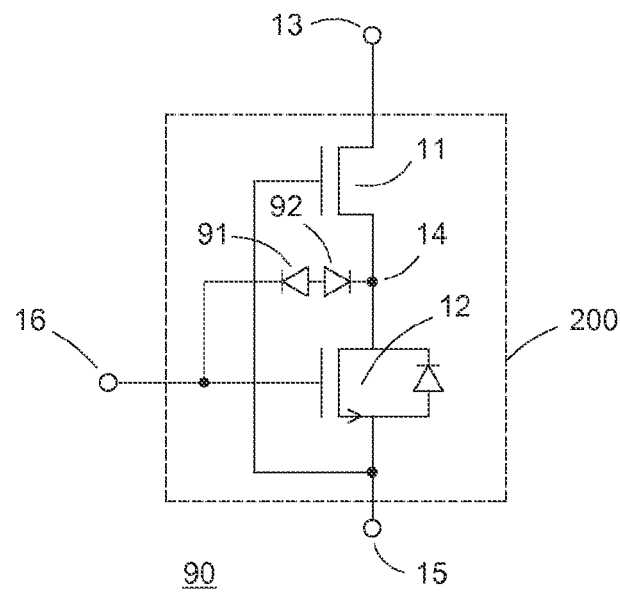
FIG. 10 schematically illustrates an example of an embodiment of a portion of another semiconductor device that is an alternate embodiment of the semiconductor devices of FIGS. 1 and 9 in accordance with the present invention.

FIG. 10 schematically illustrates an example of an embodiment of a portion of a semiconductor device 90 that is an alternate embodiment of devices 10 or 85. Device 90 is substantially similar to devices 10 and 85 except that device 90 includes a pair of diodes 91 and 92 connected in a back-to-back diode pair configuration or as back-to-back diodes. If transistor 12 is in a disabled state, leakage current from transistor 11 flows though diode 92 and diode 91 to the circuit connected to the gate of transistor 12. Thus, the back-to-back diodes shunt the leakage current from transistor 11 to flow to the circuit connected to the gate of transistor 12 instead of charging the drain-to-source capacitance of transistor 12. Although only one pair of back-to-back diodes is illustrated, device 90 may include multiple series connected back-to-back diode pairs. Those skilled in the art will appreciate that transistor 12 may include a parasitic body diode (illustrated as dashed lines) and that this body diode is a different diode than the back-to-back diodes.

Figure 11:
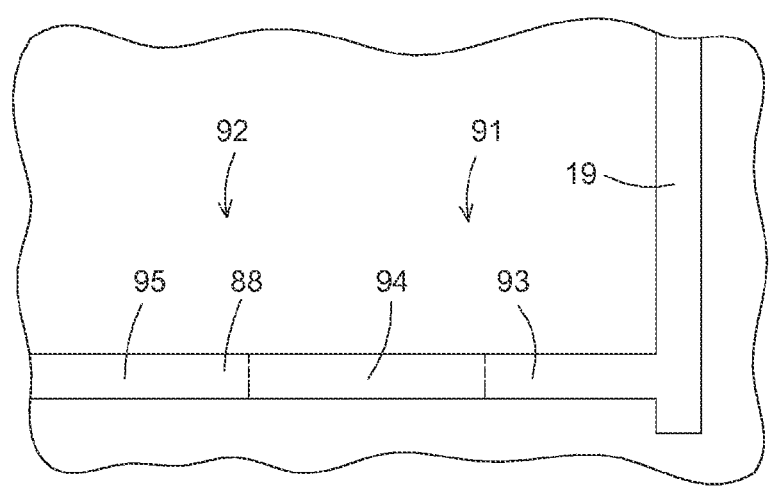
FIG. 11 illustrates an enlarged plan view of an example of an embodiment of a portion of a transistor illustrating examples of optional elements suitable for use with the transistors of FIGS. 1-4 and 6-7 in accordance with the present invention.

FIG. 11 illustrates an enlarged plan view of an example of an embodiment of a portion of transistor 12 illustrating one example of resistor 86 and/or the back-to-back diodes of FIG. 10. In an embodiment, resistor 86 may be formed as a length of doped polysilicon 88. For example, polysilicon 88 may be formed to have one end abutting conductor 19 and another end connected to the drain of transistor 12. An embodiment may include forming diodes 91 and 92 as a length of polysilicon having multiple doped regions, as illustrated by dashed lines. For example, a region or portion 93 of polysilicon 88 may be doped N-type to form the cathode of diode 91 connected to the gate of transistor 12. A portion 94 of polysilicon 88 that is adjacent to and abutting portion 93 may be doped P-type to form the anode of diodes 91 and 92. A portion 95 of polysilicon 88 that is adjacent to and abutting portion 94 may be doped N-type to form the cathode of diode 91. Portion 95 may be connected to the drain of transistor 12 (not shown).

Those skilled in the art will understand that an embodiment of a semiconductor device may comprise:

an MOS transistor, such as for example transistor 12, formed as a plurality of transistor cells, for example cells 49 and/or 72, on a semiconductor substrate, such as for example substrate 40 or substrate 42;

a body region of a first cell of the plurality of transistor cells formed as a first doped region, such as for example region 41 or region 67, having a width and a length, the first doped region having a first conductivity type;

a source region of the first cell formed as a second doped region, such as for example region 26 or region 27 or region 78, within the first doped region, the second doped region having a second conductivity type;

a gate structure, such as gate structure 22 or gate structure 74, formed adjacent to the source region and a portion of the body region, the gate structure having an internal gate conductor, such as for example conductor 31 and/or conductor 75, that is connected to an external gate conductor, such as external gate conductor 19, that overlies the semiconductor substrate and is external to the gate structure; and a doping concentration of the first doped region formed to increase along the length, 34, of the first doped region with increasing distance from the external gate conductor.

Another embodiment of the semiconductor device may include that the MOS transistor may be a silicon MOS transistor formed on a silicon substrate, such as for example substrate 40 or 42, wherein the first doped region is doped silicon.

An embodiment may include that the doping concentration may increase with increasing distance from an intersection of the internal gate conductor with the external gate conductor, such as for example near the intersection of conductor 19 and conductor 31.

In an embodiment may include the semiconductor device may include that the MOS transistor includes a vertical MOS transistor wherein a portion of the semiconductor substrate forms a portion of a drain region of the MOS transistor.

Another embodiment may include a trench gate structure, such as for example structure 23, that includes a gate conductor wherein the gate structure extends a distance into the first doped region and wherein a first portion of the gate structure is adjacent to the first doped region and a second portion of the gate structure is adjacent to the second doped region.

In an embodiment the MOS transistor may include a planar MOS transistor with a portion of the gate structure adjacent to and overlying a portion of the first doped region.

An embodiment may include a transistor, such as for example transistor 11, formed from a III or II series material and coupled in a cascade configuration with the MOS transistor.

Another embodiment may include one of back-to-back diodes, such as for example diodes 91/92, or a resistor coupled having a first terminal coupled to a gate electrode of the MOS transistor and a second terminal coupled to a drain electrode of the MOS transistor.

In another embodiment each transistor cell of the plurality of transistor cells may include a body region having a doping concentration that increases along the length, such as for example length 34, of the first doped region with increasing distance from the external gate conductor.

In an embodiment each transistor cell of the plurality of transistor cells may include a gate structure that one of overlies or extends into the first doped region.

Those skilled in the art will understand that a method of forming a semiconductor device may comprise:

forming a gate structure adjacent to a body region along a length of the body region; and forming a threshold voltage, such as Vth for example, of the semiconductor device to have a first value at an interior portion, such as for example toward position 37, of the semiconductor device and a second value at another portion of the semiconductor device that is distal from the interior portion wherein the second value is less than the first value.

Another embodiment of the method may include forming the first value at interior portions where the gate structure is adjacent to interior portions of the body region and forming the second value at other portions where the gate structure is adjacent to distal portions of the body region.

An embodiment of the method may include forming the threshold voltage to vary with distance along the length of the body region.

In an embodiment, the method may include forming the threshold voltage to vary with increasing distance from a distal end of the gate structure.

Another embodiment of the method may include forming the threshold voltage to increase with increasing distance from a distal end of the gate structure.

An embodiment of the method may include forming the device to include a vertical MOS transistor having a gate structure formed as a trench type of gate structure.

Another embodiment of the method may include forming the semiconductor device to include a silicon MOS transistor wherein forming the threshold voltage may include forming the body region of the silicon MOS transistor to have a first doping concentration at the interior portion of the silicon MOS transistor and a second doping concentration at the another portion of the silicon MOS transistor wherein the first doping concentration is greater than the second doping concentration.

An embodiment of may include forming the first doping concentration to increase from the second doping concentration with increasing distance from the another portion of the silicon MOS transistor.

Another embodiment of may include forming a silicon MOS transistor with a gate insulator having a thickness that varies from a first thickness at the interior portion of the semiconductor device to a second thickness at another portion of the semiconductor device that is distal from the interior portion wherein the second thickness is greater than the first thickness.

Those skilled in the art will appreciate that an embodiment of a semiconductor device may comprise:

an MOS transistor, such as for example transistor 12, formed as a plurality of transistor cells, such as for example one of cells 49 or 72, on a semiconductor substrate, such as for example substrate 40 or 42, the MOS transistor having an MOS gate, a source, and a drain;

a first transistor, such as for example transistor 11, formed from a III or IV series semiconductor material, the first transistor having a first gate, a first source, and a first drain;

the MOS transistor coupled in a cascode configuration with the first transistor, the MOS transistor having an MOS gate and an MOS source; and one of a resistor or back-to-back diodes, such as for example back-to-back diodes 91 and 92, coupled in a series configuration between the MOS gate and the MOS source.

In view of all of the above, it is evident that a novel device and method is disclosed. Included, among other features, is forming a silicon MOS transistor to have a threshold voltage Vth that varies along a length of a body region of the transistor. The varying threshold voltage improves the resistance to transient voltages that may be induced onto the gate of the transistor. An embodiment may include forming the doping concentration of a body region to vary along a length of the transistor. Varying the doping concentration is one method to vary the threshold voltage Vth and provide the advantages thereof. Another embodiment may include a method of shunting a current received on a drain of the transistor to a circuit connected to a gate of the transistor. Shunting the current to the circuit connected to the gate minimizes the Vds voltage in the off state of the transistor thereby the transistor such as for example improving the long term reliability of the transistor.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, even though the features are explained in reference to a silicon transistor connected to a heterojunction transistor, the features may be applied to any silicon transistor regardless of the other elements including transistor types connected thereto. For example, the features apply to MOS transistors with other geometries such as ones with trenched gate structures, to shielded gate structures, and to split shield electrode under the gate in the trench As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. An semiconductor device comprising:
an MOS transistor formed as a plurality of transistor cells on a semiconductor substrate;
a body region of a first cell of the plurality of transistor cells formed as a first doped region having a first conductivity type;
a source region of the first cell formed as a second doped region within the first doped region, the second doped region having a second conductivity type;
a gate structure formed adjacent to the source region and a portion of the body region, the gate structure having an internal gate conductor that is connected to an external gate conductor that overlies the semiconductor substrate and is external to the gate structure; and
the first doped region having a width and a length and a depth wherein the length is greater than the width and greater than the depth wherein a direction of the width is substantially orthogonal to a direction of the length, and a direction of the depth is substantially orthogonal to the direction of both the length and width, the length extends substantially laterally along a side of the gate structure and in a direction away from the external gate conductor toward an interior of the body region, the first doped region having a first end proximal to the external gate conductor and also having a second end that is spaced the length away from the first end with the interior of the first doped region positioned along the length and distal from the first and second ends, a midpoint of the length positioned approximately at a midpoint between the first and second ends, the first doped region including dopants wherein a doping concentration of the dopants of the first doped region is formed to increase laterally along the length of the first doped region toward the interior of the first doped region with increasing distance from the external gate conductor wherein the doping concentration at substantially the midpoint of the length is greater than at approximately a quarter of a distance between the first end and the midpoint, and the doping concentration is lower at the first and second ends than at the quarter of the distance.

2. The semiconductor device of claim 1 wherein the MOS transistor is a silicon MOS transistor formed on a silicon substrate wherein the first doped region is doped silicon.

3. The semiconductor device of claim 1 wherein the doping concentration increases with increasing distance from an intersection of the internal gate conductor with the external gate conductor.

4. The semiconductor device of claim 1 wherein the MOS transistor includes a vertical MOS transistor wherein a portion of the semiconductor substrate forms a portion of a drain region of the MOS transistor.

5. The semiconductor device of claim 4 including a trench gate structure that includes a gate conductor wherein the trench gate structure extends a distance into the first doped region and wherein a first portion of the trench gate structure is adjacent to the first doped region and a second portion of the trench gate structure is adjacent to the second doped region.

6. The semiconductor device of claim 1 wherein the MOS transistor includes a planar MOS transistor with a portion of the gate structure adjacent to and overlying a portion of the first doped region.

7. The semiconductor device of claim 1 further including a transistor formed from a III or II series material and coupled in a cascade configuration with the MOS transistor.

8. The semiconductor device of claim 1 further including one of back-to-back diodes or a resistor coupled having a first terminal coupled to a gate electrode of the MOS transistor and a second terminal coupled to a drain electrode of the MOS transistor.

9. The semiconductor device of claim 1 wherein each transistor cell of the plurality of transistor cells includes a body region having a doping concentration that increases along the length of the first doped region with increasing distance from the external gate conductor.

10. The semiconductor device of claim 1 wherein each transistor cell of the plurality of transistor cells includes a gate structure that either overlies or extends into the first doped region.

11. The semiconductor device of claim 1 wherein the doping concentration of the first doped region increases one of linearly or non-linearly with increasing distance from both the first and second ends toward the interior of the first doped region.

12. The semiconductor device of claim 1 wherein the first doped region-is in a plane of the first and second ends.

13. The semiconductor device of claim 1 further including a second source region formed as a third doped region of the second conductivity type within the first doped region;
  a second gate structure formed adjacent to the second source region and another portion of the body region, wherein the width of the first doped region is a distance between the gate structure and the second gate structure.

14. The semiconductor device of claim 1 wherein the length does not extend from the first gate structure to another adjacent gate structure.

15. A semiconductor device comprising:
  an MOS transistor formed as a plurality of transistor cells on a semiconductor substrate, the MOS transistor having an MOS gate, an MOS source, and an MOS drain;
  a first transistor formed as a heterojunction transistor, the first transistor having a first gate, a first source, and a first drain;
  the MOS transistor coupled in a cascode configuration with the first transistor; and
  back-to-back diodes in a series configuration between the MOS gate and the MOS drain wherein one of the back-to-back diodes is directly connected to the MOS drain and wherein the back-to-back diodes have anodes connected directly together.

16. The semiconductor device of claim 15 wherein the heterojunction transistor includes GaN.

17. A semiconductor device comprising:
  an MOS transistor formed as a plurality of transistor cells on a semiconductor substrate;
  a body region of a first cell of the plurality of transistor cells formed as a first doped region having a width and a length and a depth wherein the length is greater than the width, the first doped region having a first conductivity type;
  a source region of the first cell formed as a second doped region within the first doped region, the second doped region having a second conductivity type;
  a gate structure formed adjacent to the source region and a portion of the body region, the gate structure having an internal gate conductor that is connected to an external gate conductor that overlies the semiconductor substrate and is external to the gate structure; and
  the first doped region including dopants wherein a doping concentration of the dopants of the first doped region is formed to increase laterally along the length of the first doped region toward interior portions of the first doped region with increasing distance from the external gate conductor wherein the first doped region has a first end and has a second end that is spaced the length from the first end with an interior of the first doped region positioned distal from the first and second ends and in a plane of the first and second ends, wherein the doping concentration at the interior is twice the doping concentration at the first end and the doping concentration of the first doped region increases with distance from the first end toward the interior.

* * * * *